(12) United States Patent
Grasse et al.

(10) Patent No.: US 10,886,370 B2
(45) Date of Patent: Jan. 5, 2021

(54) SEMICONDUCTOR DEVICE INCLUDING SILICON CARBIDE BODY AND METHOD OF MANUFACTURING

(71) Applicant: Infineon Technologies AG, Neubiberg (DE)

(72) Inventors: Florian Grasse, Hohenthurn (AT); Axel Sascha Baier, Neubiberg (DE); Wolfgang Bergner, Klagenfurt (AT); Barbara Englert, Munich (DE); Christian Strenger, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/669,742

(22) Filed: Oct. 31, 2019

(65) Prior Publication Data

US 2020/0144370 A1 May 7, 2020

(30) Foreign Application Priority Data

Nov. 7, 2018 (DE) .................. 10 2018 127 797

(51) Int. Cl.
| | | |
|---|---|---|
| *H01L 29/10* | (2006.01) | |
| *H01L 29/16* | (2006.01) | |
| *H01L 29/08* | (2006.01) | |
| *H01L 21/04* | (2006.01) | |
| *H01L 29/78* | (2006.01) | |

(52) U.S. Cl.
CPC ........ *H01L 29/1083* (2013.01); *H01L 21/046* (2013.01); *H01L 29/086* (2013.01); *H01L 29/1095* (2013.01); *H01L 29/1608* (2013.01); *H01L 29/7811* (2013.01); *H01L 29/7813* (2013.01)

(58) Field of Classification Search
CPC ............. H01L 29/1083; H01L 29/7811; H01L 29/1095; H01L 29/7813; H01L 29/086; H01L 29/1008
See application file for complete search history.

(56) References Cited

U.S. PATENT DOCUMENTS

| | | | |
|---|---|---|---|
| 2012/0264746 A1* | 10/2012 | Schor ................... | C07D 243/14 514/221 |
| 2017/0345905 A1* | 11/2017 | Siemieniec ......... | H01L 29/0696 |
| 2018/0175153 A1 | 6/2018 | Schulze et al. | |

* cited by examiner

*Primary Examiner* — Dung A. Le
(74) *Attorney, Agent, or Firm* — Murphy, Bilak & Homiller, PLLC

(57) ABSTRACT

A silicon carbide body includes a drift structure having a first conductivity type, a body region, and a shielding region. The body and shielding regions, of a second conductivity type, are located between the drift structure and a first surface of the silicon carbide body. First and second trench gate stripes extend into the silicon carbide body. The body region is in contact with a first sidewall of the first trench gate stripe. The shielding region is in contact with a second sidewall of the second trench gate stripe. The second sidewall has a first length in a lateral first direction parallel to the first surface. A supplementary region of the first conductivity type contacts one or more interface areas of the second sidewall. The one or more interface areas have a combined second length along the first direction, the second length being at most 40% of the first length.

15 Claims, 8 Drawing Sheets

SEMICONDUCTOR DEVICE INCLUDING SILICON CARBIDE BODY AND METHOD OF MANUFACTURING

TECHNICAL FIELD

The present disclosure is related to a semiconductor device with silicon carbide body, in particular, to a semiconductor device with trench gate stripes.

BACKGROUND

Power semiconductor devices are typically the switches and rectifiers in electric circuits for transforming electrical energy, for example, in DC/AC converters, AC/AC converters or AC/DC converters and in electric circuits that drive heavy inductive loads, e.g., in motor driver circuits. The dielectric breakdown field strength of silicon carbide (SiC) is high compared to silicon. Therefore, SiC devices may be significantly thinner than equivalent silicon devices with the same voltage blocking capability.

The transistor cells of SiC TMOSFETs (SiC trench metal oxide semiconductor field effect transistors) can be asymmetric, wherein stripe-shaped trench gate electrodes control transistor channels along one of two opposite longitudinal sidewalls of the trench gate stripes.

It is desirable to improve device characteristics of SiC devices that are based on asymmetric transistor cells with trench gate electrodes.

SUMMARY

An embodiment of the present disclosure relates to a semiconductor device that includes a silicon carbide body. The silicon carbide body includes a drift structure of a first conductivity type, a body region, and a shielding region. The body region and the shielding region have a second conductivity type and are located between the drift structure and a first surface of the silicon carbide body. The semiconductor device further includes a first and a second trench gate stripe that extend into the silicon carbide body. The body region is in contact with a first sidewall of the first trench gate stripe. The shielding region is in contact with a second sidewall of the second trench gate stripe. The second sidewall has a first length in a first direction parallel to the first surface. A supplementary region of the first conductivity type is in contact with one or more interface areas of the second sidewall.

Another embodiment of the present disclosure relates to another semiconductor device including a silicon carbide body. The silicon carbide body includes a drift structure of a first conductivity type, a body region, and a shielding region. The body region and the shielding region have a second conductivity type and are located between the drift structure and a first surface of the silicon carbide body. The semiconductor device further includes a first and a second trench gate stripe that extend into the silicon carbide body. The body region is in contact with a first sidewall of the first trench gate stripe. The shielding region is in contact with a second sidewall of the second trench gate stripe. The second sidewall has a first length in a first direction parallel to the first surface. A supplementary region of the first conductivity type is in contact with one or more interface areas of the second sidewall. A surface portion of the shielding region separates the supplementary region and the first surface.

A further embodiment of the present disclosure relates to a further semiconductor device that includes a silicon carbide body. The silicon carbide body includes a drift structure of a first conductivity type, a body region, and a shielding region. The body region and the shielding region have a second conductivity type and are located between the drift structure and a first surface of the silicon carbide body. The semiconductor device further includes a first and a second trench gate stripe that extend into the silicon carbide body. The body region is in contact with a first sidewall of the first trench gate stripe. The shielding region is in contact with a second sidewall of the second trench gate stripe. The second sidewall has a first length in a first direction parallel to the first surface. A supplementary region of the first conductivity type is in contact with one or more interface areas of the second sidewall. A contact portion extends from the first surface into the silicon carbide body. The contact portion is in contact with the supplementary region.

BRIEF DESCRIPTION OF THE DRAWINGS

The accompanying drawings are included to provide a further understanding of the invention and are incorporated in and constitute a part of this specification. The drawings illustrate embodiments of a semiconductor device and together with the description serve to explain principles of the embodiments. Further embodiments are described in the following detailed description and the claims.

DETAILED DESCRIPTION

Figure 1A:
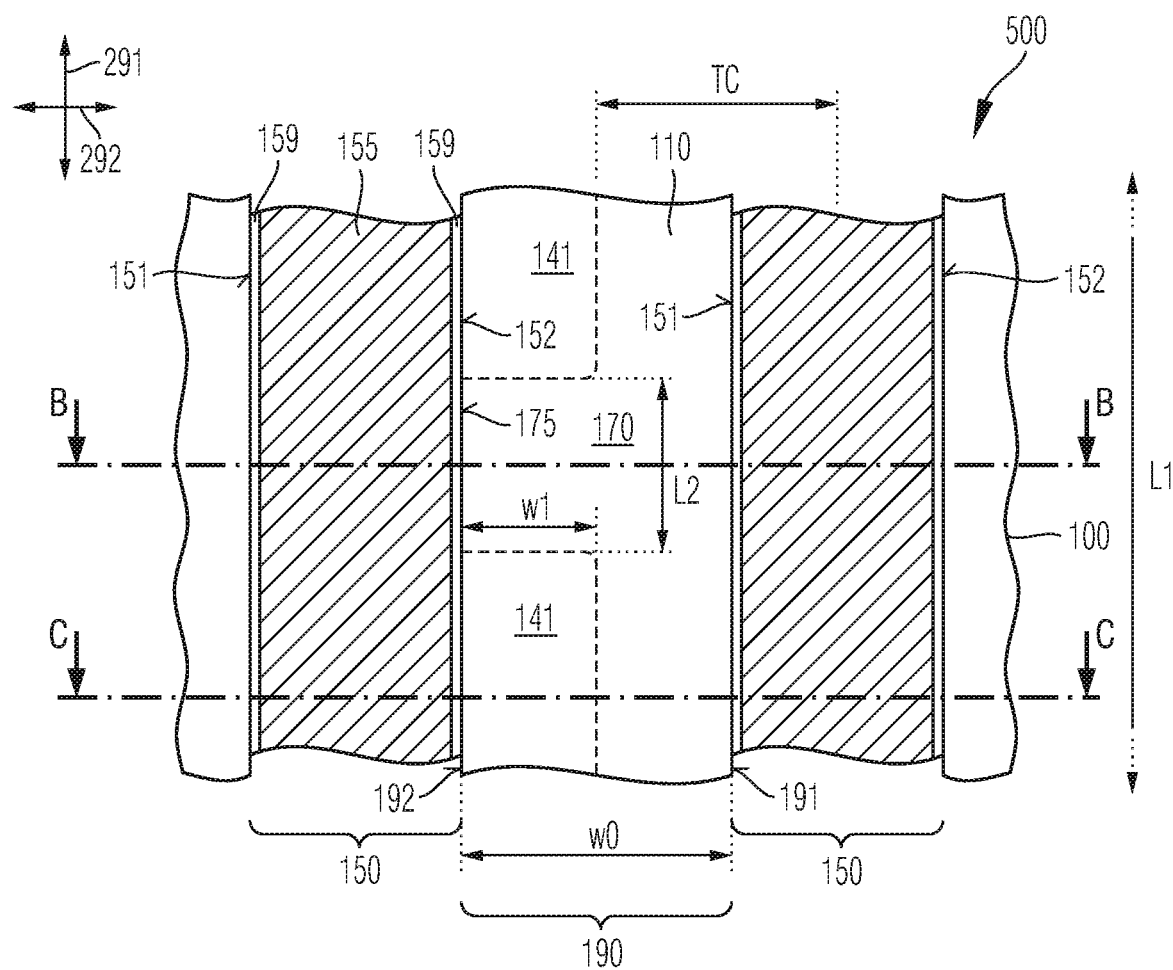
FIGS. 1A-1C show one schematic horizontal and two vertical cross-sectional views of a portion of a semiconductor device with trench gate stripes and a supplementary region according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

According to at least one embodiment, a semiconductor device may include a silicon carbide body. The silicon carbide body may include a drift structure, a body region and a shielding region. The drift structure has a first conductivity type. The body region and the shielding region have a second conductivity type, which is complementary to the first conductivity type. For example, the drift structure is n doped and the body and shielding regions are p doped, or vice versa. The body region and the shielding region are located between the drift structure and a first surface of the silicon carbide body. The silicon carbide body may include further doped layers and/or laterally separated doped regions.

The drift structure includes at least a drift zone functioning as a voltage sustaining layer, wherein a depletion region is mainly formed in the drift zone if the semiconductor device is in a blocking state. A vertical extension of the drift zone and a dopant concentration in the drift zone are selected such that the semiconductor device reaches its nominal blocking voltage capability. The drift structure may include further doped regions of the first conductivity type, e.g., a current spread layer, a contact portion, a field stop layer, a buffer layer, and/or a barrier layer.

First and second trench gate stripes form trench gate structures that extend into the silicon carbide body. Each trench gate stripe has a lateral length extension in a lateral first direction parallel to the first surface. A width of the trench gate stripe perpendicular to the first direction may be smaller than the lateral length extension. For example, the width of the trench gate stripes may be at most 30% or at most 10% of the lateral length extension of the trench gate stripe along the lateral first direction.

Each trench gate stripe has a first sidewall at a first side and a second sidewall at an opposite second side. The first sidewall and the second sidewall may have the same length along the first direction. For example, the trench gate stripe, the first and the second sidewall may have the same length along the lateral length extension of the trench gate structure. At least the second sidewall has a first length along the first direction.

The body region is in contact with the first sidewall of the first trench gate stripe. The shielding region is in contact with the second sidewall of the second trench gate stripe.

In an on-state of the semiconductor device an inversion channel forms in the body region. The body region may be separated from the second sidewall of the second trench gate stripe. For example, the shielding region may be located between the body region and the second sidewall of the second trench gate stripe.

The shielding region may have a higher maximum dopant concentration than the body region. The dopant concentration in the shielding region may be sufficiently high such that no inversion layer is formed along the second sidewall of the second trench gate stripe, at least as long as the semiconductor device operates within the SOA. The shielding region is separated from the first sidewall of the first trench gate stripe. For example, the body region may be located between the shielding region and the first sidewall of the first trench gate stripe.

A supplementary region of the first conductivity type is in contact with one or more interface areas of the second sidewall. An interface area is defined as a surface portion of the second sidewall that is in direct contact with the supplementary region. The total/combined interface area may be continuous or discontinuous along the first direction. The interface area has a total/combined second length along the first direction. The second length is the maximum longitudinal extension of the total/combined interface area along the first direction. The second length is at most 40%, e.g., at most 30% at most 10%, or at most 1% of the first length of the second sidewall of trench gate stripes in the lateral first direction. For example, in at least one sectional plane running along the lateral first direction, the supplementary region may cover at most 40% of the second side surface.

The supplementary region may be electrically connected and/or coupled to a source potential. A gate electrode in the trench gate stripes may be electrically connected or coupled to a gate potential. A gate dielectric may be formed between the gate electrode and the silicon carbide body. The supplementary region and the gate electrode form a capacitor-like structure, wherein the total size of the interface area, a thickness of the gate dielectric and the material of the gate dielectric determine a contribution of the capacitor-like structure to an overall gate-to-source capacity $C_{gs}$ of the semiconductor device.

A ratio $C_{gd}/C_{gs}$ between a Miller capacitance $C_{gd}$ and the gate-to-source capacity $C_{gs}$ affects the probability for that the semiconductor device unintentionally turns on. A supplementary region with one or more interface areas, whose total longitudinal extension is at most 40% of the trench gate stripe length, may suffice to ensure that $C_{gs}$ is sufficiently high for a negligibly low probability for an unintentional turn-on. In addition, the presence of the supplementary region along at most 40% of the trench gate stripe length may remain without significant effect on the functionality of the shielding region. It is possible that the supplementary region affects the functionality of the shielding region only to a negligible degree.

According to an embodiment the silicon carbide body may include an active region and a termination region surrounding the active region. Predominantly in the active region, a load current flows through the silicon carbide body in an approximately vertical direction orthogonal to the first surface in an on-state of the semiconductor device, wherein the load current flows between load contact structures of a first load electrode at the front side and a second load electrode at the rear side. The termination region is devoid of load contact structures such that only a small portion of the load current may laterally spread into the termination region. The termination region may form a frame around the active region. The termination region may include gate contact structures that extend into the trench gate stripes. The termination region may further include field termination structures for sustaining, in a blocking state of the semiconductor device, a lateral electrical field at the front side.

The supplementary region may be formed in the termination region and may be completely absent in the active region. As a consequence, in the active region the shielding region can extend along the complete horizontal cross-sectional area of a SiC mesa between the first and the second trench gate stripes without interruptions along the SiC mesas. The supplementary region can be provided without negative impact on the quality of an ohmic contact between the shielding region and the load contact structures.

According to an embodiment, the semiconductor device may further include a source region formed in the silicon carbide body between the first surface and the body region. The supplementary region and the source region may be structurally connected. In other words, the source region and the supplementary region may directly adjoin each other. In case the source region and the supplementary region originate from the same process, for example, from the same implantation process(es), the source region and the supplementary region may be directly adjoining portions of a continuous doped region of the first conductivity type. If forming the source region and forming the supplementary region differ in at least one process, for example, if at least one of several implants is effective in only one of the source region and the supplementary region, then the source region and the supplementary region may form a unipolar junction.

According to an embodiment, a maximum dopant concentration in the supplementary region may differ from a maximum dopant concentration in the source region. When the dopant concentrations in the source region and the supplementary region are decoupled from each other, each dopant concentration may be selected individually to settle distinct requirements. According to an alternative embodiment, the maximum dopant concentration in the supplementary region and in the source region may be equal or may deviate from each other by not more than an amount induced by process imperfection, e.g., by not more than 5%, e.g. not more than 1% of the higher maximum dopant concentration. Source region and supplementary region may result from the same process.

According to an embodiment, a maximum vertical extension of the supplementary region may be greater than a maximum vertical extension of the source region. For example, the supplementary region may extend deeper into the silicon carbide semiconductor body than the source region. Since the gate-to-source capacitance depends on the total size of the one or more interface areas of the supplementary region along the second sidewall, increasing the vertical extension of the supplementary region may increase $C_{gs}$ without increasing the second length such that a comparatively large $C_{gs}$ can be combined with a low loss of available contact area between the load contact structures and the shielding region. Forming a supplementary region with a higher maximum vertical extension than the maximum vertical extension of the source region may comprise at least one additional implantation step (in particular with a higher implantation energy) compared to implanting the source region.

According to an embodiment, the supplementary region and the second sidewall are in contact in one single, continuous interface area. The single interface area may be located in the active region or in the termination region or may overlap with both the active region and the termination region. Due to lithographic process limitations, the reproducibility of lateral dimensions of doped regions may deteriorate with decreasing length and width. A one-part supplementary region may combine high reproducibility with low impact on the available contact area.

According to another embodiment, the supplementary region may include a plurality of supplementary portions, wherein top portions of the shielding region may laterally separate the supplementary portions along the lateral first direction. Splitting up the supplementary region into a plurality of supplementary portions may provide a more uniform contact resistance and/or Cgs distribution along the first direction.

For example, a distance between neighboring supplementary portions and a center-to-center distance between neighboring supplementary portions may be uniform along the complete length of the trench gate stripes to provide a uniform $C_{gs}$ distribution.

Alternatively, the distance between neighboring supplementary portions and/or the center-to-center distance between neighboring supplementary portions may be a function of a distance to a termination region. For example, at least one of the distance and the center-to-center distance between neighboring supplementary portions may increase or decrease with increasing distance to the closest portion of the termination region to obtain a specific distribution of the contact resistance and/or $C_{gs}$.

According to an embodiment, the supplementary region may directly adjoin the first surface. The supplementary region may be directly connected to load contact structures at the front side, wherein the load contact structures may be in contact with the first surface of the silicon carbide body. The supplementary region may be formed with the same processes forming the source region. Alternatively, forming the supplementary region may include one or some of the processes for forming the source region.

According to another embodiment, a surface portion of the shielding region may separate the supplementary region and the first surface. The supplementary region is at a distance to and spaced from the first surface (so-called "buried supplementary region"). In this way, a complete top surface of a SiC mesa between the trench gate stripes may be available for forming low-resistive ohmic contacts between the source region and/or the shielding region on one side and the load contact structures on the other side.

According to an embodiment, a contact portion may extend from the first surface into the silicon carbide body, wherein the contact portion is in contact with the supplementary region. The contact portion may form a lateral ohmic contact area at least with the supplementary region and may enlarge the total contact area between the first load electrode on one side and the supplementary region, the source region, and/or the shielding region on the other side. The contact portion is at least partly formed below the first surface of the silicon carbide body.

According to an embodiment, a maximum dopant concentration in the shielding region may be higher than a maximum dopant concentration in the body region. For example, the dopant concentration in the shielding region may be high enough such that no inversion layer forms along the second sidewall of the second trench gate stripe at least as long as the semiconductor device operates within the SOA.

According to at least one other embodiment, a semiconductor device may include a silicon carbide body, wherein the silicon carbide body may include a drift structure, a body region and a shielding region. The drift structure has a first conductivity type. The body region and the shielding region have a complementary second conductivity type and may be located between the drift structure and a first surface of the silicon carbide body. The semiconductor device further includes a first and a second trench gate stripe that extend into the silicon carbide body. The body region is in contact with a first sidewall of the first trench gate stripe. The shielding region is in contact with a second sidewall of the second trench gate stripe. The second sidewall has a first length in a first direction parallel to the first surface. A supplementary region of the first conductivity type is in contact with one or more interface areas of the second sidewall. A surface portion of the shielding region may be located between the supplementary region and the first surface.

The supplementary region is formed at a distance to the first surface (so-called "buried supplementary region"). By burying the supplementary region, a complete top surface of a SiC mesa between the trench gate stripes can be available for forming low-resistive ohmic contacts between load contact structures and the shielding region and/or further doped regions in the SiC mesa, e.g., a source region. Therefore, a good contact to the shielding region may be ensured.

According to an embodiment, along the first direction the one or more interface areas have a combined second length of at most 40% of the first length.

According to another embodiment, the supplementary region may extend along the second trench gate stripe in an active region of the silicon carbide body. For example, a total length of the one or more interface areas along the lateral first direction may be at least 50%, e.g., at least 90% of the first length of the trench gate stripes or may be equal to the first length. By increasing the total length of the supplementary region, $C_{gs}$ may be efficiently increased since the supplementary region extends along a larger portion of the second sidewall of the trench gate stripe. Meanwhile, it may be possible to ensure a good contact to the shielding region by burying the supplementary region.

According to at least one further embodiment, a semiconductor device may include a silicon carbide body that may include a drift structure, a body region and a shielding region. The drift structure has a first conductivity type. The body region and the shielding region have a complementary second conductivity type and may be located between the drift structure and a first surface of the silicon carbide body. The semiconductor device further includes a first and a second trench gate stripe that extend into the silicon carbide body. The body region is in contact with a first sidewall of the first trench gate stripe. The shielding region is in contact with a second sidewall of the second trench gate stripe. The second sidewall has a first length in a first direction parallel to the first surface. A supplementary region of the first conductivity type is in contact with one or more interface areas of the second sidewall. A contact portion may extend from the first surface into the silicon carbide body, wherein the contact portion is in contact with the supplementary region.

According to an embodiment, the one or more interface areas have a combined second length of at most 40% of the first length.

According to an embodiment, the supplementary region may extend along the second trench gate stripe in an active region of the silicon carbide body. For example, a total length of the one or more interface area along the lateral first direction in the active region may be at least 50%, e.g., at least 90% of the first length of the trench gate stripes or may be equal to the first length.

Figure 1B:
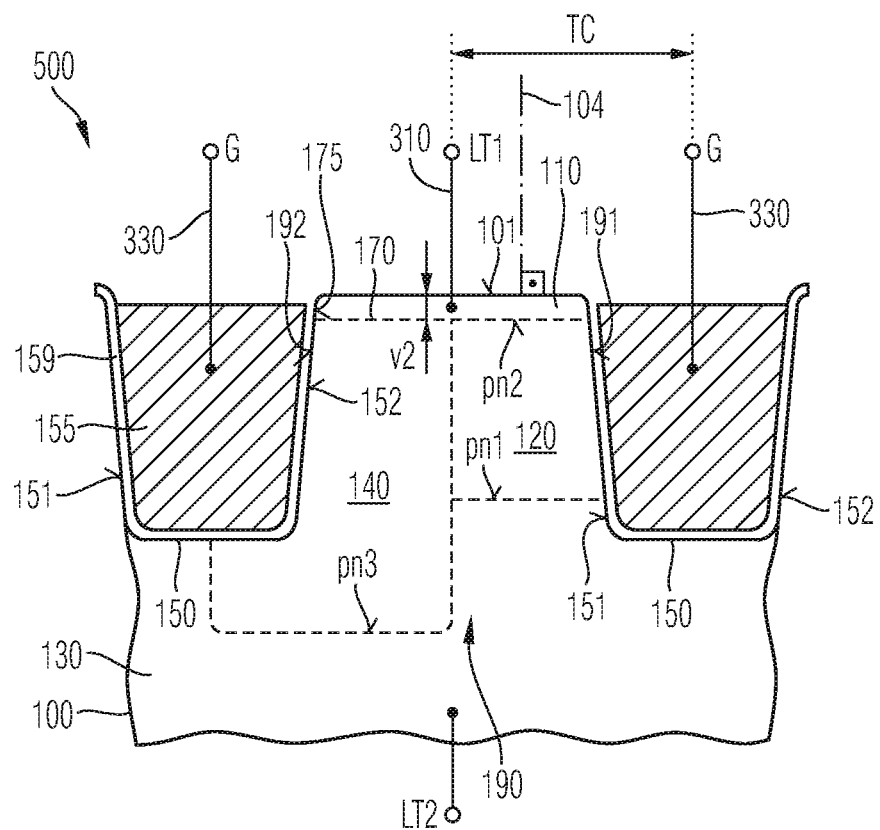
Figure 1C:
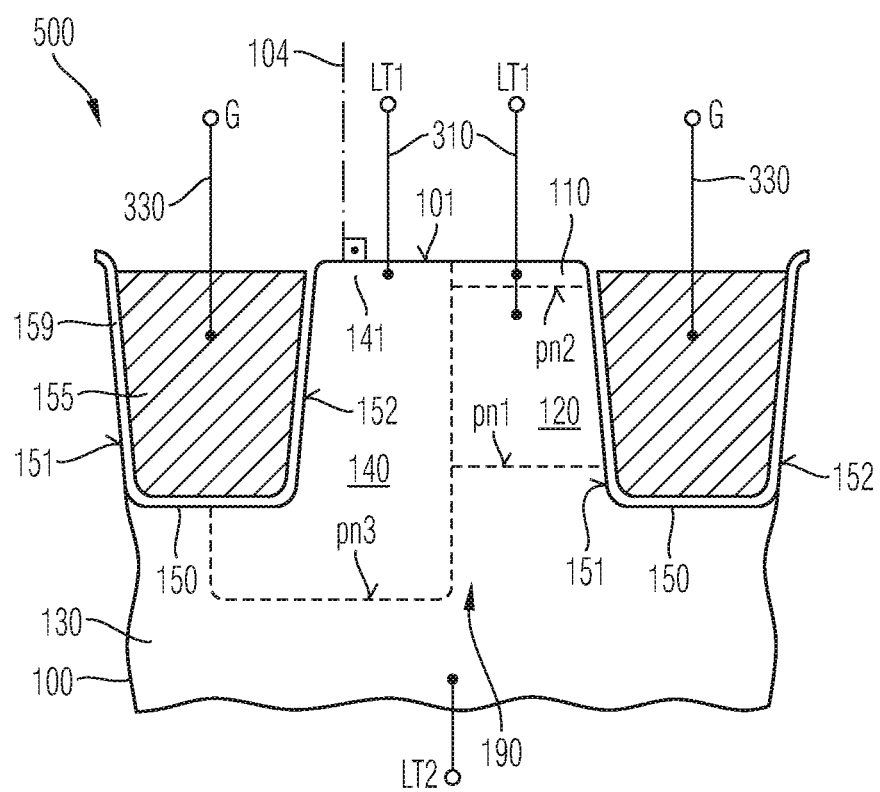

FIGS. 1A-1C refer to a semiconductor device 500 including transistor cells TC. The semiconductor device 500 may be or may include an IGFET (insulated gate field effect transistor), for example, an MOSFET (metal oxide semiconductor FET) in the usual meaning including FETs with metal gates as well as FETs with gates from semiconductor material or an MCD (MOS controlled diode), by way of example.

The silicon carbide body 100 may include or consist of single crystalline silicon carbide, e.g., a silicon carbide crystal including the main constituents silicon and carbon. The silicon carbide crystal may include unwanted impurities like hydrogen, oxygen and/or fluorine and may also include intended impurities, e.g., dopant atoms. The polytype of the silicon carbide crystal may be 15R, 2H, 6H, or 4H. The silicon carbide body 100 may include or consist of a silicon carbide layer grown by epitaxy.

A first surface 101 at a front side of the silicon carbide body 100 may be planar or stepped. A surface normal 104 orthogonal to a planar first surface 101 or orthogonal to a mean plane of a stepped first surface 101 defines a vertical direction, e.g., of the transistor (cell). Directions orthogonal to the surface normal 104 define horizontal directions of the transistor which are also referred to as lateral directions. Longitudinal directions are lateral directions in the following.

The surface normal 104 may coincide with a main lattice direction or may be tilted to a main lattice direction by an off-axis angle, wherein the off-axis angle may be in a range from 2° to 8°. At the rear side of the silicon carbide body 100, a second surface may extend parallel to a planar first surface 101 or parallel to a mean plane of a stepped first surface 101.

A total thickness of the silicon carbide body 100 between the first surface 101 and the second surface is related to a nominal blocking capability of the semiconductor device 500 and may be in the range of several hundred nm to several hundred µm.

The transistor cells TC are formed along trench gate stripes 150 that extend from the first surface 101 into the silicon carbide body 100. The trench gate stripes 150 may be long stripes extending along a lateral first direction 291 through an active region of the semiconductor device 500. Portions of the silicon carbide body 100 between neighboring trench gate stripes 150 form SiC mesas 190. Between the transistor cells TC and the second surface the silicon carbide body 100 includes a drift structure 130 of a first conductivity type. The drift structure 130 may be electrically connected with a second load electrode 320.

The trench gate stripes 150 include a conductive gate electrode 155 that may include or consist of a heavily doped polycrystalline silicon layer and/or a metal-containing layer. The gate electrode 155 may be electrically connected to a gate metallization 330 that forms or that is electrically connected or coupled to a gate terminal G.

A gate dielectric 159 separates the gate electrode 155 from the silicon carbide body 100 along at least one side of the trench gate stripe 150. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V. The trench gate stripes 150 may exclusively include the gate electrode 155 and the gate dielectric 159 or may include further conductive and/or dielectric structures in addition to the gate electrode 155 and the gate dielectric 159.

A length of the trench gate stripes 150 along the lateral first direction 291 is greater than a width of the trench gate stripes 150 along a lateral second direction 292 orthogonal to the first direction 291

The trench gate stripes 150 may be equally spaced, may have equal width, and may form a regular stripe pattern, wherein a center-to-center distance between the trench gate stripes 150 may be in a range from 1 µm to 10 µm, e.g., from 2 µm to 5 µm. A vertical extension of the trench gate stripes 150 may be in a range from 0.3 µm to 5 µm, e.g., in a range from 0.5 µm to 2 µm. At the bottom, the trench gate stripes 150 may be rounded.

The trench gate stripes 150 may be vertical with respect to the first surface 101 or may taper with increasing distance to the first surface 101. For example, a taper angle of the trench gate stripes 150 with respect to the vertical direction may be equal to the off-axis angle or may deviate from the off-axis angle by not more than ±1 degree such that at least a first mesa sidewall 191 of two opposite longitudinal mesa sidewalls 191, 192 of the SiC mesa 190 is formed in a crystal plane in which charge carrier mobility is high, e.g., a {11-20} crystal plane. A second mesa sidewall 192 opposite to the first mesa sidewall 191 may be tilted to the same crystal plane by twice the off-axis angle α, e.g., by 4 degree or more, for example, by about 8 degree. The first and second mesa sidewalls 191, 192 are on opposite longitudinal sides of the SiC mesa 190 and are in direct contact with two neighboring trench gate stripes 150.

First sidewalls 151 of the trench gate stripes 150 are in contact with the first mesa sidewalls 191. Second sidewalls 152 of the trench gate stripes 150 are in contact with the second mesa sidewalls 192. In a vertical cross-section parallel to the second direction 292, all first sidewalls 151 are at the same side (left-hand side) and all second sidewalls 152 are at the opposite side (right-hand side). The second sidewalls 152 have a first length L1. The first sidewalls 151 may have the same length. The first length L1 may be up to several millimeters.

The illustrated embodiment shows a SiC mesa 190 between a first trench gate stripe 150 at the right hand side and second trench gate stripe 150 at the left hand side of the figure. The SiC mesa 190 includes a source region 110, a body region 120, a first portion of a shielding region 140, and a supplementary region 170. The source region 110 is between the first surface 100 and the body region 120 and may be in direct contact with the first sidewall 151 of the first trench gate stripe 150.

The body region 120 separates the source region 110 and the drift structure 130. The body region 120 and the drift structure 130 form a first pn junction pn1. The body region 120 and the source region 110 form a second pn junction pn2. The body region 120 directly adjoins the first sidewall 151 of the first trench gate stripe 150. A vertical extension of the body region 120 corresponds to a channel length of the transistor cells TC and may be in a range from 0.2 µm to 1.5 µm. The source region 110 and the body region 120 are electrically connected with a first load electrode 310 at the front side.

The first load electrode 310 may form or may be electrically connected with or coupled to a first load terminal LT1, which may be an anode terminal of an MCD or a source terminal of an IGFET. The second load electrode 320 may form or may be electrically connected with or coupled to a second load terminal LT2, which may be a cathode terminal of an MCD or a drain terminal of an IGFET.

The first portion of the shielding region 140 is arranged between the body region 120 and the second sidewall 152 of the second trench gate stripe 150. A second portion of the shielding region 140 may vertically overlap with the second trench gate stripe 150. In other words, the second portion of the shielding region 140 is formed below the second trench gate stripe 150, e.g., between the trench gate stripe 150 and the second surface 102. The shielding region 140 is electrically connected or coupled to the first load electrode 310.

A maximum dopant concentration in the shielding region 140 may be higher than a maximum dopant concentration in the body region 120. A vertical dopant concentration profile in the shielding region 140 may have a local maximum at a position below the trench gate stripe 150. Along the second mesa sidewall 192 a dopant concentration in the shielding region 140 may be higher, i.e., at least ten times higher than a dopant concentration in the body region 120 along the first mesa sidewall 191.

The shielding region 140 and the drift structure 130 form a third pn junction pn3 that may provide the semiconductor device 500 with integrated fly-back diode functionality. In addition, in a blocking state of the semiconductor device 500, the second portion of the shielding region 140 below the trench gate stripe 150 may shield an active portion of the gate dielectric 159 along the first sidewall 151 against a potential applied to the second load electrode 320.

The supplementary region 170 is in direct contact with an interface area 175 of the second sidewall 152 of the second trench gate stripe 150. The supplementary region 170 and the source region 110 may be structurally connected (as illustrated) or may be structurally separated (not illustrated).

The supplementary region 170 may form one single bridge extending from the source region 110 to the second sidewall 152 of the second trench gate stripe 150. Outside the supplementary region 170, top portions 141 of the shielding region 140 may separate the source region 110 and the second sidewall 152 of the second trench gate stripe 150. The supplementary region 170 may be formed in or close to an end section of the SiC mesa 190 or in or close to a central section of the SiC mesa 190, wherein the terms "end section" and "central section" refer to the lateral extension of the SiC mesa 190 along the first direction 291.

A width w1 of the supplementary region 170 along the lateral second direction 292 may be in a range from 40% to 60% of a mesa width w0 of the SiC mesa 190. A maximum vertical extension v2 of the supplementary region 170 orthogonal to the first surface 101 may be at least 200 nm and at most 1 µm.

A length of the supplementary region 170 along the lateral first direction 291 may be constant over the complete width w1, may decrease with decreasing distance to the second sidewall 152, or may increase with decreasing distance to the second sidewall 152. The length may increase or decrease gradually, e.g., linearly, or in steps.

The interface area 175 has a second length L2 along the first direction 291, wherein the second length L2 is less than 40% of the first length L1 of the second sidewalls 152, e.g., about 30% of the first length L1. Alternatively, a second length L2 of less than 1.5 µm may be sufficient to achieve a desired gate-to-source capacitance, wherein a lower boundary value for the second length L2 is given by process restrictions. Alternatively, the second length L2 may be in a range from 1.5 µm to 10 µm, wherein the supplementary region 170 can be formed at high reliability at acceptable deviations from a target value and wherein the supplementary region 170 extends along only a comparatively short portion of the SiC mesa 190.

The transistor cells TC may be n-channel FET cells with p-doped body regions 120, n-doped source regions 110 and n-doped drift structure 130. Alternatively, the transistor cells TC are p-channel FET cells with n-doped body regions 120, p-doped source regions 110 and p-doped drift structure 130. The following description refers to n-channel FET cells.

The gate dielectric 159 capacitively couples portions of the body regions 120 with the gate electrode 155. When a potential at the gate electrode 155 exceeds a threshold voltage of the semiconductor device 500, the electric field effects that the minority charge carriers in the body regions 120 form inversion channels along the gate dielectric 159, wherein the inversion channels connect the source regions 110 with the drift structure 130, thereby turning on the semiconductor device 500. In the on-state, a load current between the first and second load electrodes 310, 320 flows along the first mesa sidewalls 191. The comparatively high dopant concentration in the shielding regions 140 may suppress the formation of inversion channels along the second mesa sidewalls 192 at operation conditions within the SOA.

In case the semiconductor device 500 is an IGFET, a gate-to-drain capacitance $C_{gd}$ is effective between the second load terminal LT2 and the gate terminal G, a gate-to-source capacitance $C_{gs}$ is effective between the gate terminal G and the first load terminal LT1 and a drain-to-source capacitance $C_{ds}$ is effective between the first and the second load terminals LT1, LT2. A threshold voltage charge $Q_{th}$ defines the amount of charge necessary for lifting the potential at the gate terminal G to a threshold voltage at which the load current path between the drain and source becomes conductive and a Miller charge $Q_{gd}$ loads the gate-to-drain capacitance $C_{gd}$.

Typically, the ratio $Q_{gd}/Q_{th}$ affects the probability for that the semiconductor device 500 unintentionally turns on when voltage peaks, which may be generated when the semiconductor device 500 turns off, are coupled to the gate electrode 155 through the Miller capacitance $C_{gd}$. The greater the Miller capacitance $C_{gd}$ is in relation to $C_{gs}$, the higher the probability and the risk that the semiconductor device 500 unintentionally turns on. Unintentional turn-on decreases the efficiency of a switching circuit including the semiconductor device 500. For example, if the semiconductor device 500 is used as high-side switch or low-side switch in a half-bridge circuit, a short-circuit condition with both switches turned on may occur. On the other hand, with decreasing ratio $Q_{gd}/Q_{th}$ the probability for triggering undesired oscillations in the application increases. Depending on the ratio $Q_{gd}/Q_{th}$ the semiconductor device 500 has either a high risk for unintentional turn-on or a high risk for unintentional oscillations.

With supplementary regions 170 having a comparatively low extension along the first direction 291 it is possible to increase $C_{gs}$ sufficiently and without negative impact on other device parameters.

Figure 2A:
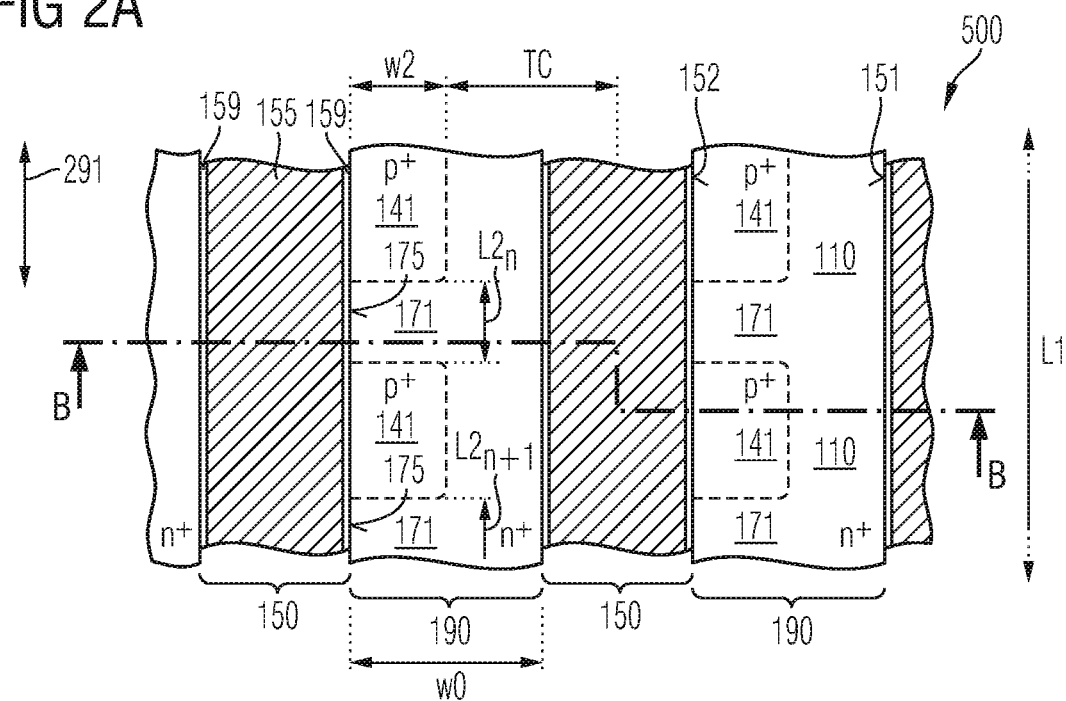
FIGS. 2A-2B show schematic horizontal and vertical cross-sectional views of a portion of a semiconductor device with trench gate stripes according to an embodiment related to n-channel SiC-MOSFETs.
Figure 2B:
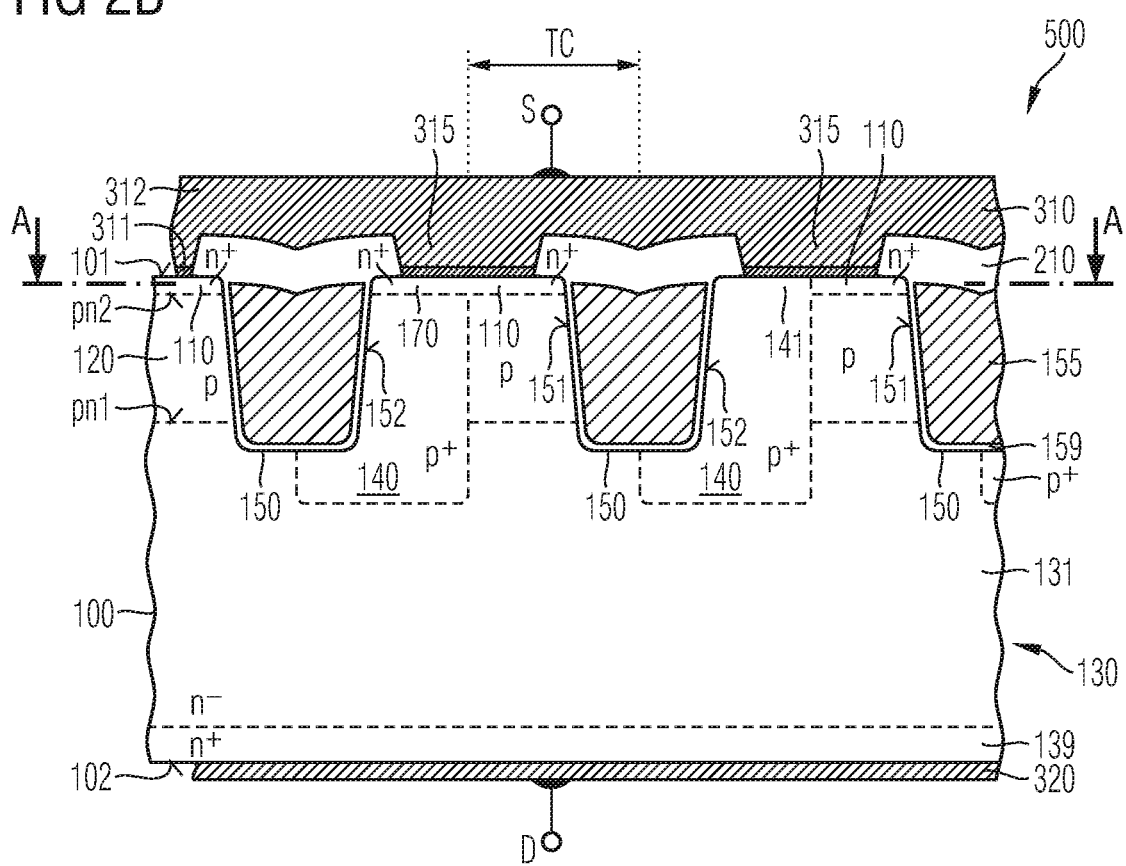

In FIGS. 2A and 2B the semiconductor device 500 is an n-channel SiC-TMOSFET, wherein the first load electrode 310 forms or is electrically connected to a source terminal S and the second load electrode 320 forms or is electrically connected to a drain terminal D. The semiconductor device 500 is based on a silicon carbide body 100 with a first surface 101 and a second surface 102, a plurality of transistor cells TC, a plurality of SiC mesas 190, a plurality of trench gate stripes 150, and with a drift structure 130 as described with reference to FIGS. 1A-1C.

The drift structure 130 may include a heavily doped contact portion 139, which directly adjoins the second surface 102, and a lightly doped drift zone 131 between the transistor cells TC and the heavily doped contact portion 139.

The heavily doped contact portion 139 may be or may include a substrate portion obtained from a crystalline ingot or may include a heavily doped portion of a layer formed by epitaxy. Along the second surface 102, a dopant concentration in the contact portion 139 is sufficiently high to ensure a low-resistive ohmic contact between the contact portion 139 and the second load electrode 320.

The drift zone 131 may be formed in a layer grown by epitaxy. A mean net dopant concentration in the drift zone 131 may be in the range from 1E15 cm$^{-3}$ to 5E16 cm$^{-3}$. The drift zone 131 may directly adjoin the contact portion 139.

Alternatively, a buffer layer forming a unipolar junction with the drift zone 131 may be located between the drift zone 131 and the contact portion 139, wherein a vertical extension of the buffer layer may be approximately 1 µm and wherein a mean dopant concentration in the buffer layer may be in a range from 3E17 cm$^{-3}$ to 1E18 cm$^{-3}$, by way of example.

Stripe-shaped portions of an interlayer dielectric 210 separate the gate electrodes 155 in the trench gate stripes 150 and the first load electrode 310. Load contact structures 315 extend from the first load electrode 310 through openings in the interlayer dielectric 210 to the SiC mesas 190 and are in direct contact with the source regions 110 and the shielding regions 140. The load contact structures 315 may end on the first surface 101. Alternatively, the load contact structures 315 may extend into the silicon carbide body 100.

Each of the first load electrodes 310, the load contact structures 315 and the second load electrode 320 may consist of or contain a metal, a metal compound or a metal alloy as main constituent(s).

For example, the load contact structures 315 may include a thin metal-containing interface layer 311 and a thick metal layer 312. The thin metal-containing interface layer 311 may include titanium (Ti), tantalum (Ta), nickel (Ni), and/or molybdenum (Mo) and is in direct contact with the SiC mesas 190. The thick metal layer 312 may include copper (Cu), aluminum (Al) and/or a copper-aluminum alloy (CuAl) and is formed directly on the interface layer 311.

The supplementary region 170 includes a plurality of laterally separated supplementary portions 171 and interface areas 175. In each SiC mesa 190, top portions 141 of the shielding regions 140 laterally separate neighboring supplementary portions 171 along the first direction 291. Accordingly, several separated interface areas 175 are formed along the second sidewalls 152 of the trench gate stripes 150.

A width w2 of the supplementary portions 171 along the lateral second direction 292 may be in a range from 40% to 60% of the mesa width w0. A length $L2_n$ of one of the interface areas 175 along the lateral first direction 291, in which a single supplementary portion 171 is in contact with the second sidewall 152, may be in a range from 1.5 µm to 10 µm. The total length $(L2_1+L2_2, \ldots L2_m)$ of all interface areas 175 along the first direction 291 gives the second length L2 of the plurality of interface areas 175 and is less than 40% of the first length L1 of the trench gate stripes 150.

A center-to-center distance between neighboring supplementary portions 170 and the lateral length $L2_x$ of the interface areas 175 may be uniform along the SiC mesa 190 to achieve a uniformly distributed gate-to-source capacitance $C_{gs}$. Alternatively, the center-to-center distance between neighboring supplementary portions 171 and/or the lateral length $L2_n$ of the interface areas 175 may change along the first direction 291, e.g., as a function of a distance to an end portion of the SiC mesa 190, wherein the positional distribution of the gate-to-source capacitance $C_{gs}$ may be fine-tuned.

The supplementary portions 171 and the source region 110 of the same SiC mesa 190 may be structurally connected (as illustrated) or may be structurally separated (not illustrated). Top portions 141 of the shielding regions 140 may be absent between the supplementary portions 171 and the source region 110 (as illustrated) or may laterally separate the supplementary portions 171 and the source region 110 (not illustrated). Supplementary portions 171 laterally separated from the source region 110 in the same SiC mesa 190 may be electrically connected to each other and to the source region 110 through a low impedance path via a load contact structure 315 directly adjoining the SiC mesa 190.

Along the first direction 291, a load contact structure 315 alternatingly forms low-resistive ohmic contacts with the top portions 141 of the shielding regions 140 and with the supplementary portions 171.

Figure 3A:
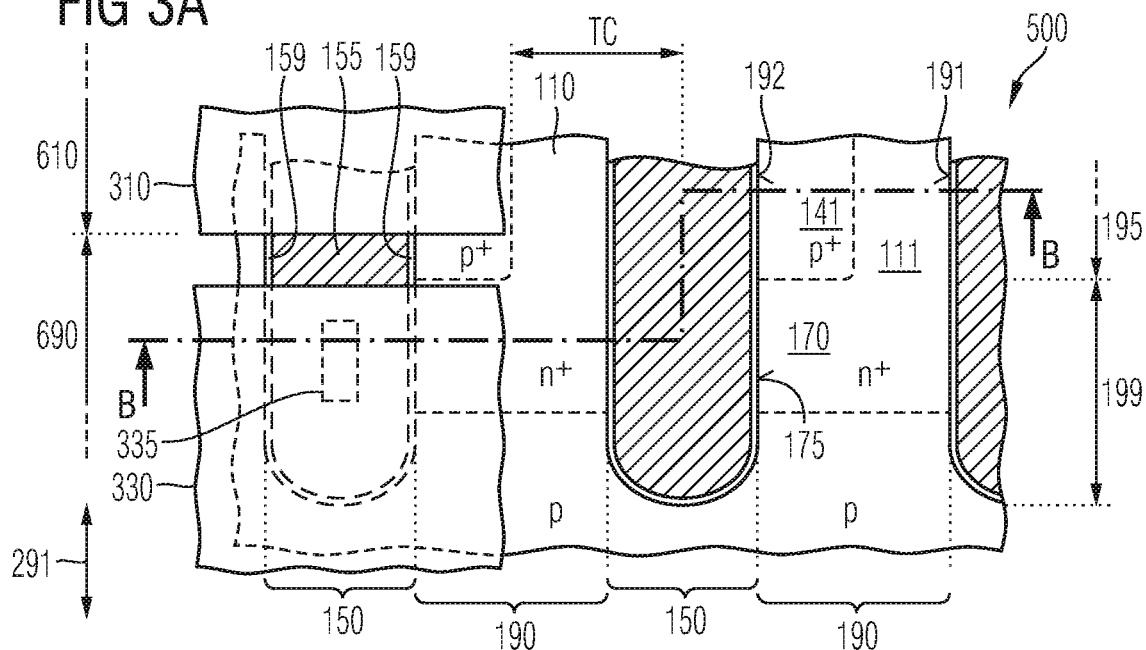
FIGS. 3A-3B show a schematic top view and a vertical cross-sectional view of a portion of a semiconductor device according to an embodiment with a supplementary region in a termination region.
Figure 3B:
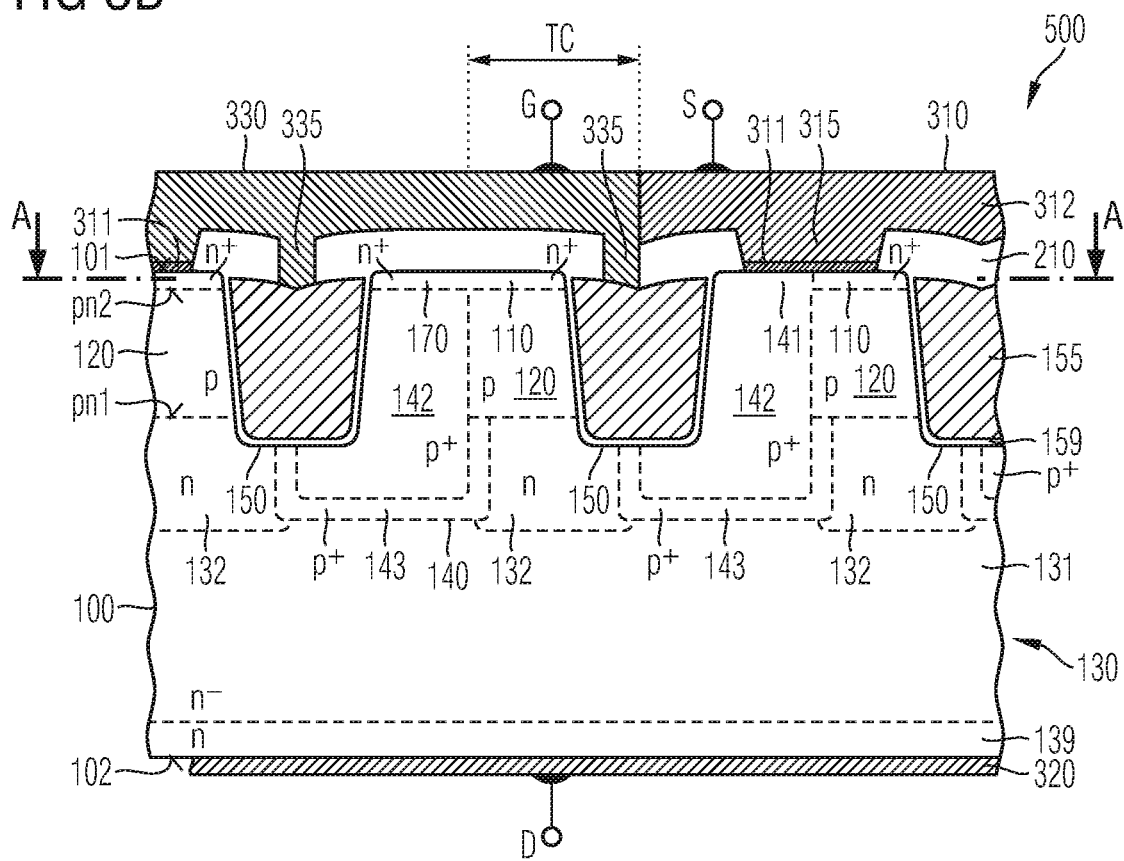

FIGS. 3A-3B illustrate mesa end portions 199 of SiC mesas 190 in a termination region 690 of a silicon carbide body 100. The termination region 690 forms a frame around a central active region 610. The active region 610 includes functional transistor cells TC that are adapted to control a load current of the semiconductor device 500. The termination region 690 is devoid of functional transistor cells TC. The termination region 690 may include edge termination structures adapted for accommodating the electric field along a lateral direction in a blocking mode of the semiconductor device 500.

In the lateral first direction 291, the trench gate stripes 150 extend through the active region 610 and extend into the termination region 690 on opposite sides of the active region 610. Each SiC mesa 190 may include one mesa main portion 195 in the active region 610 and two mesa end portions 199 in two opposite parts of the termination region 690.

In the termination region 690 a gate metallization 330 may be formed in the vertical projection of the mesa end portions 199 and in the vertical projection of end sections of the trench gate stripes 150 between the mesa end portions 199. Gate contact structures 335 may extend from the gate metallization 330 through openings in the interlayer dielectric 210 into the trench gate stripes 150 and may be in direct contact with the gate electrodes 155 in the trench gate stripes 150.

The first load electrode 310 is formed in the active region 610. Load contact structures 315 in a vertical projection of the mesa main portions 195 extend from the first load electrode 310 through openings in the interlayer dielectric 210 to the mesa main portions 195.

The supplementary region 170 is exclusively formed in one or in both of the two mesa main portions 195 of one, several or all SiC mesa(s) 190. The active region 610 may be completely devoid of portions of a supplementary region 170 and completely devoid of n doped regions in contact with the second sidewalls 152 of the trench gate stripes 150. Within the active region 610, the contact structures 315 are exclusively in contact with the source regions 110 and with top portions 141 of the shielding regions 140.

The shielding regions 140 may include shielding portions 143 and contact portions 142. The shielding portions 143 may directly adjoin the drift structure 130. The contact portions 142 connect the shielding portions 143 with the first load electrode 310 through the heavily doped top portions 141. A mean net dopant concentration in the contact portion 142 is at least ten times as high as a mean net dopant concentration in the body regions 120.

The drift structure 130 includes current spread regions 132 between the body regions 120 and the drift zone 131, wherein the current spread regions 132 may separate the body regions 120 and the drift zone 131, or wherein the current spread regions 132 may be spaced from the body regions 120. A mean dopant concentration in the current spread regions 132 is at least twice, for example, at least ten times as high as a mean dopant concentration in the drift zone 131.

Figure 4A:
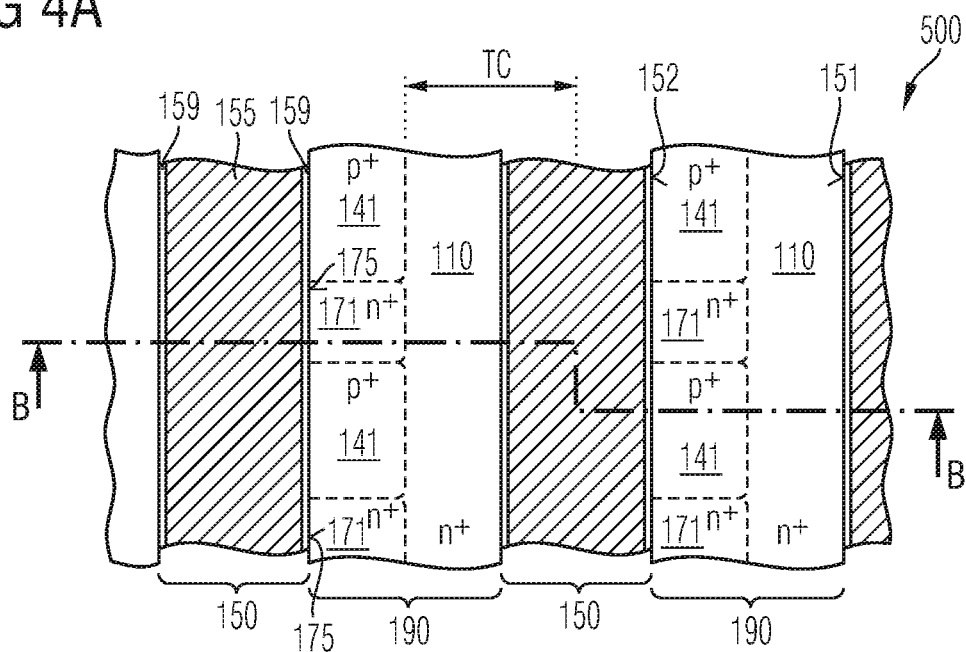
FIGS. 4A-4B show schematic horizontal and vertical cross-sectional views of a portion of a semiconductor device according to an embodiment with supplementary regions having a greater vertical extension than source regions.
Figure 4B:
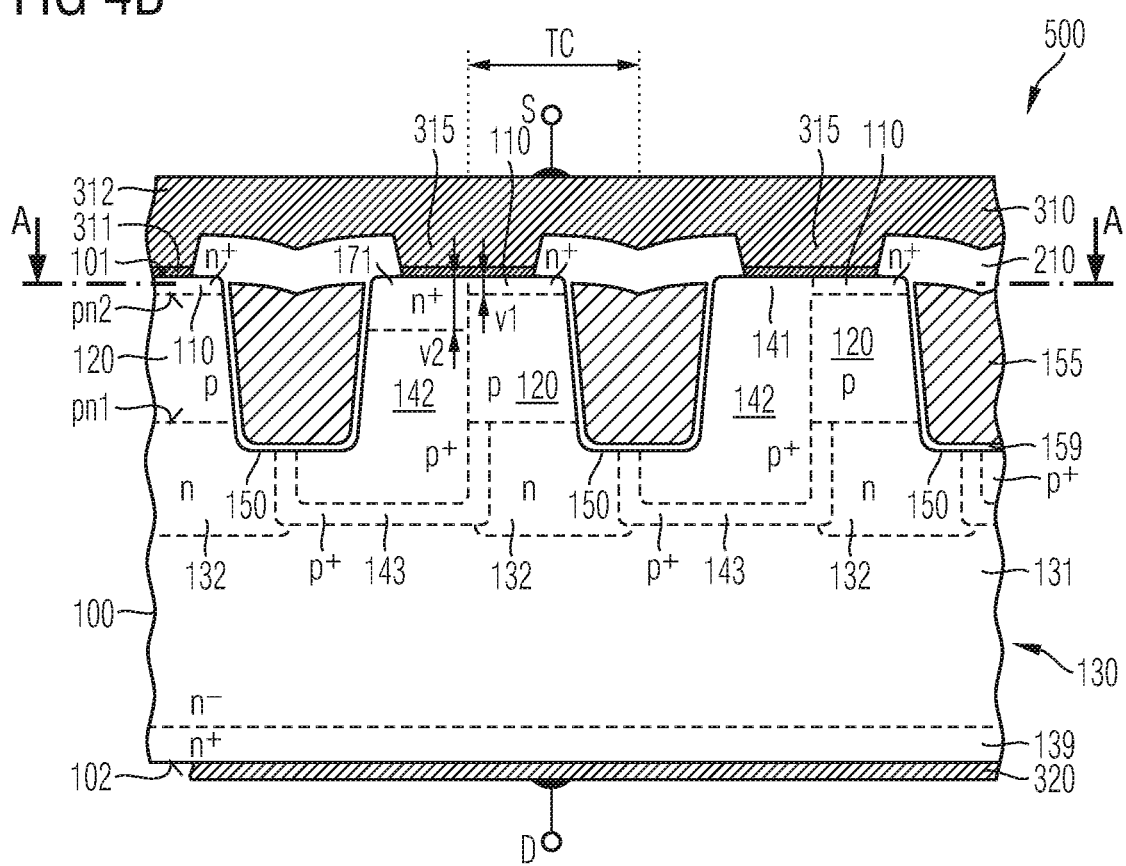

In the semiconductor device 500 of FIGS. 4A-4B, a maximum vertical extension v2 of the supplementary region 170 directly along the second sidewall 152 is greater than a maximum vertical extension v1 of the source region 110. A transition between v1 and v2 may include one or several steps or may be gradual, e.g., linear.

Figure 5A:
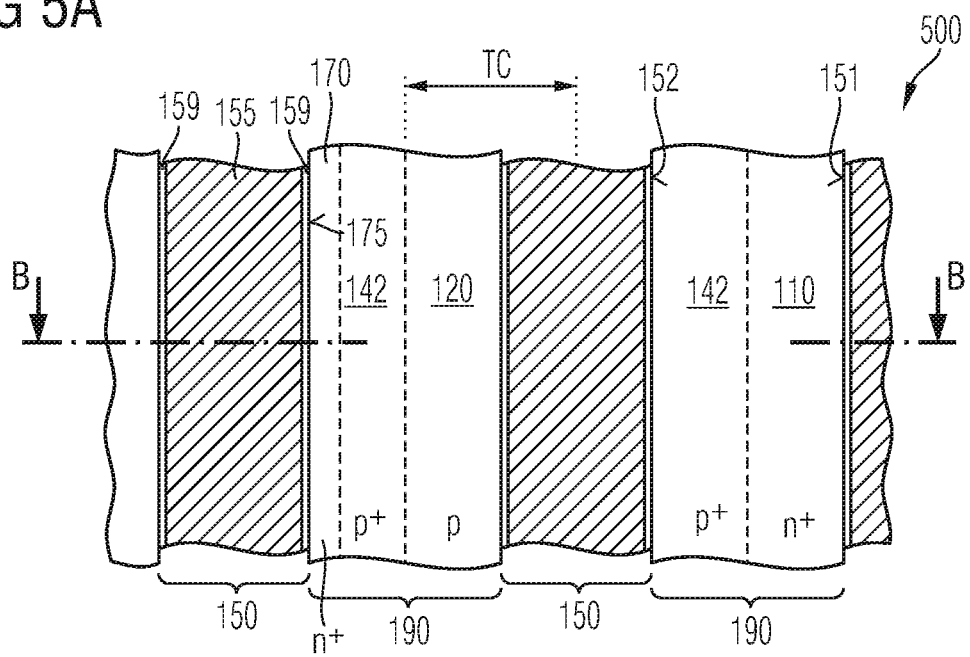
FIGS. 5A-5B show schematic horizontal and vertical cross-sectional views of a portion of a semiconductor device according to an embodiment with a supplementary region formed at a distance to a first surface of a silicon carbide body.
Figure 5B:
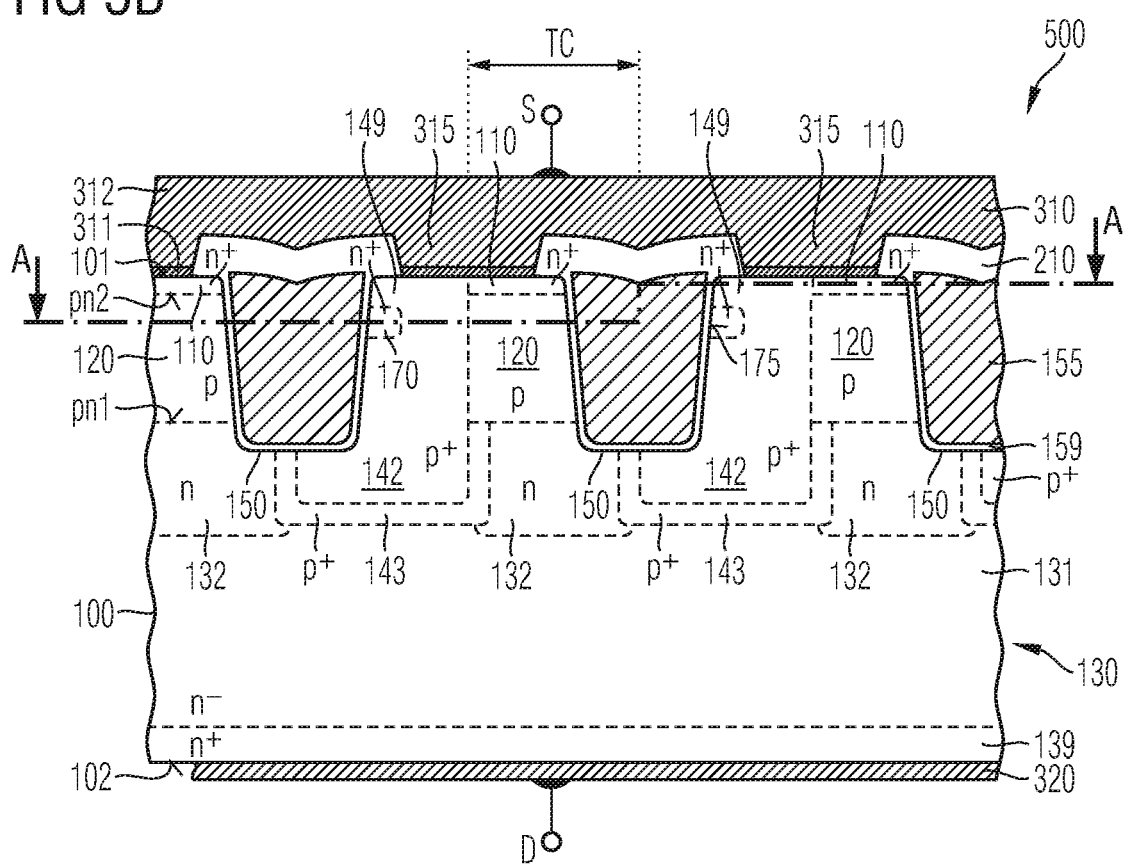

In FIGS. 5A-5B surface portions 149 of the shielding regions 140 completely separate the supplementary region 170 from the first surface 101. The shielding region 140 separates the supplementary region 170 and the source region 110 formed in the same SiC mesa 190. A second length of an interface area 175, in which the supplementary region 170 is in contact with the second sidewall 152, may be at least 50%, e.g., at least 90% or 100% of the first length of the trench gate stripes 150. Alternatively, the second length may be at most 40%, e.g., at most 10% or at most 1% of the first length.

In FIGS. 6A-7B the load contact structures 315 include contact portions 316 extending from the first surface 101 into the silicon carbide body 100. The contact portions 316 and the supplementary region 170 form lateral contact interfaces.

Figure 6A:
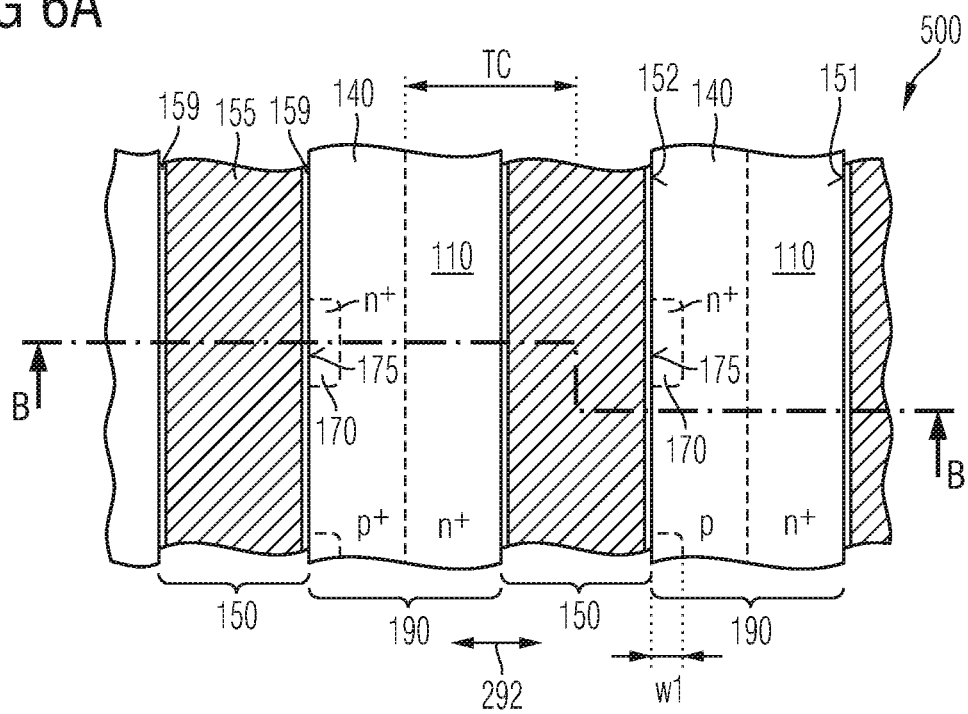
FIGS. 6A-6B show schematic horizontal and vertical cross-sectional views of a portion of a semiconductor device according to an embodiment with wide contact portions.
Figure 6B:
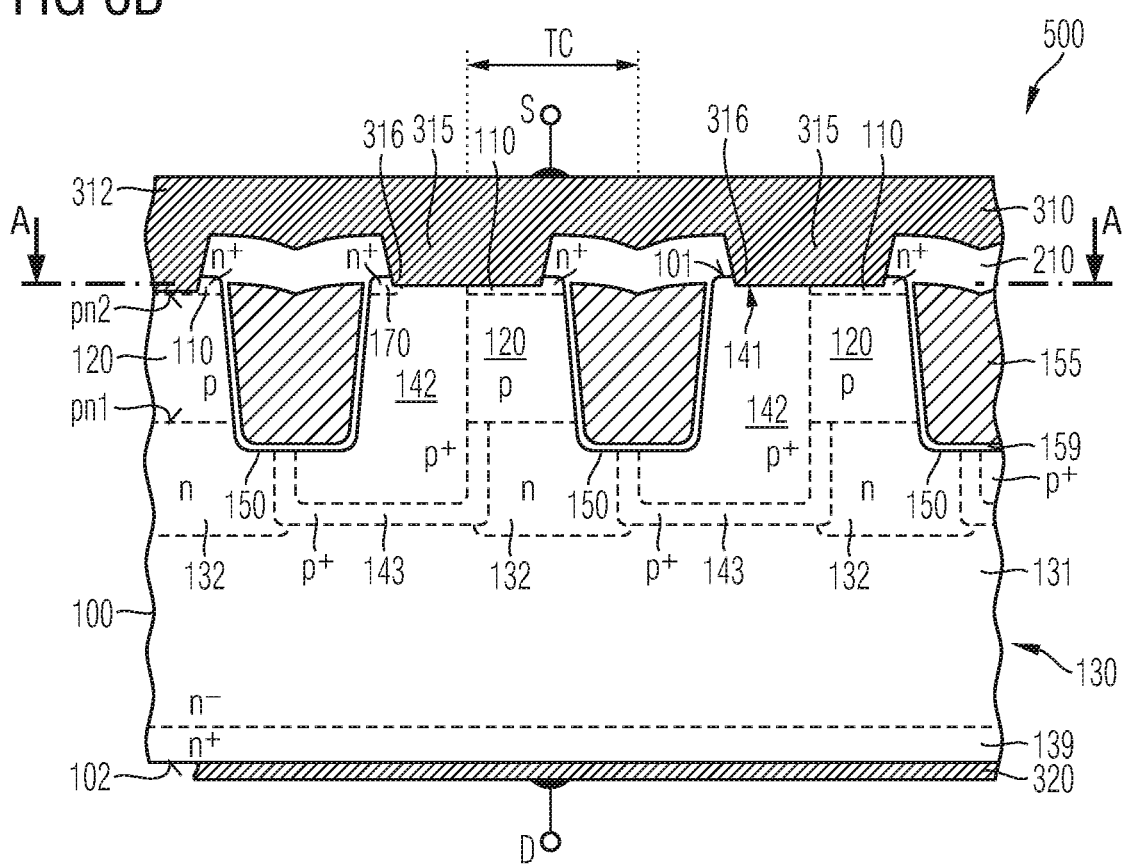

In FIGS. 6A-6B a lateral width w1 of the supplementary regions 170 parallel to the lateral second direction 292 may be at most as large as an overlap of the interlayer dielectric 210 with the SiC mesa 190 such that the interlayer dielectric 210 completely covers the supplementary regions 170.

In the plane of the first surface 101, the contact portions 316 have the same lateral width as the contact structure 315, wherein the contact portions 316 laterally adjoin both the supplementary region 170 and the source region 110 of a SiC mesa 190.

Figure 7A:
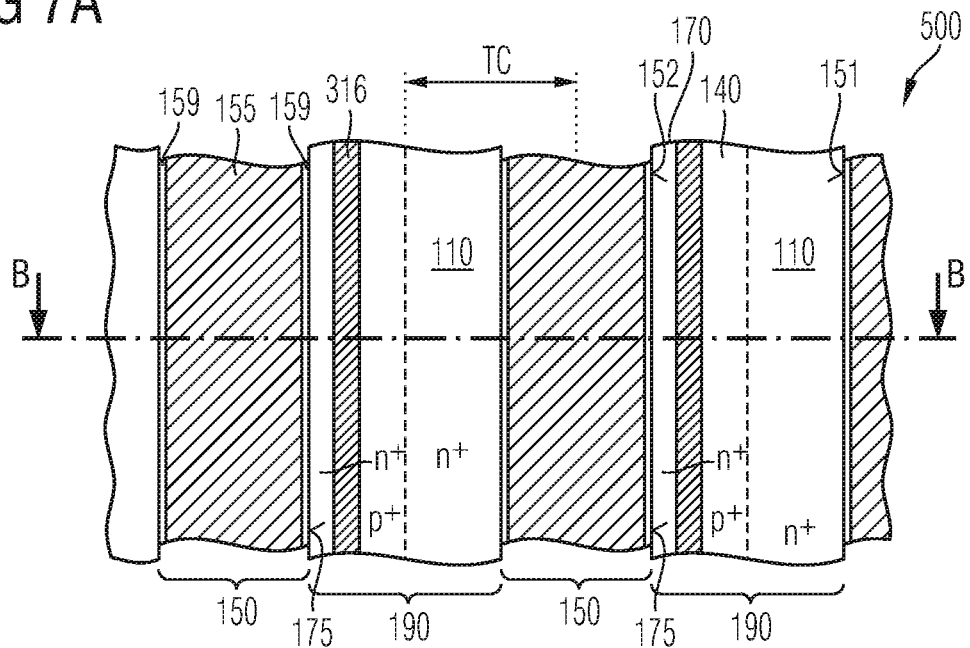
FIGS. 7A-7B show schematic horizontal and vertical cross-sectional views of a portion of a semiconductor device according to an embodiment with narrow contact portions.
Figure 7B:
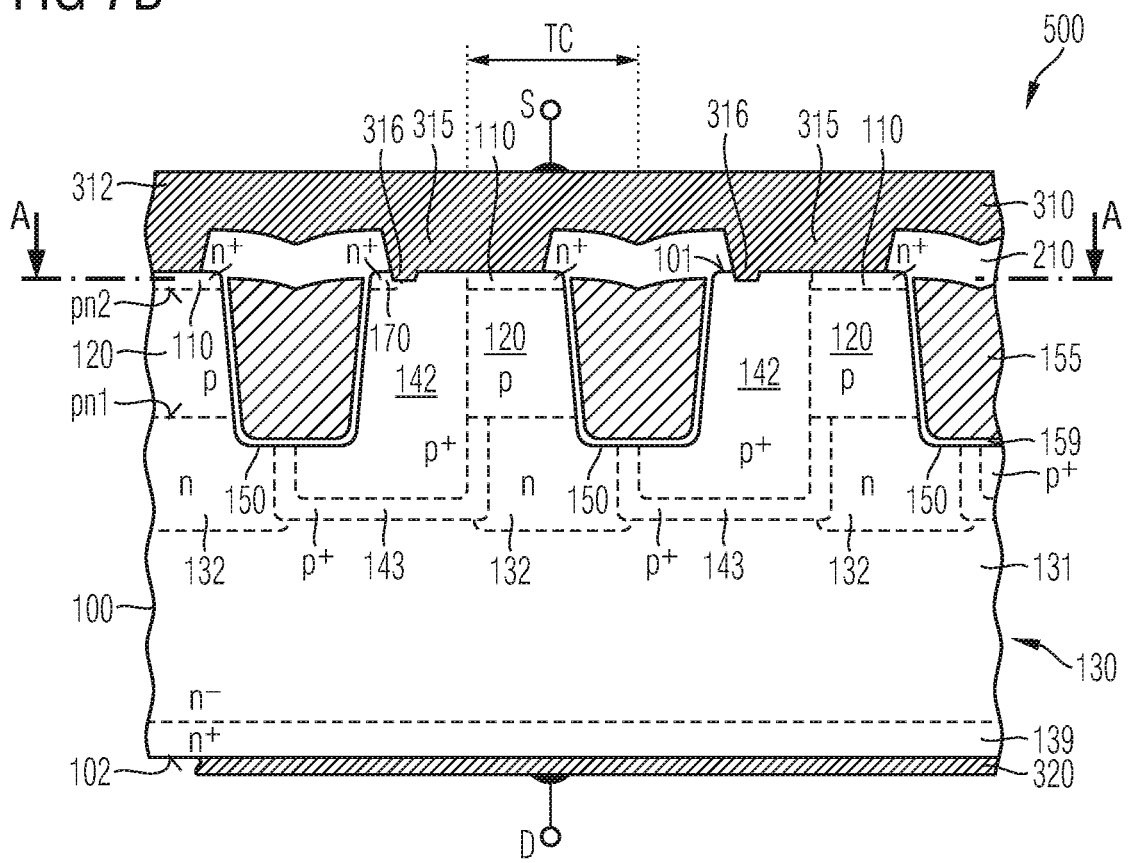

In FIGS. 7A-7B the contact portions 316 are narrower than in the embodiment shown in FIG. 6A-6B. They extend only into the shielding region 140 and/or into the supplementary region 170.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a silicon carbide body comprising a drift structure having a first conductivity type, a body region, and a shielding region, the body region and the shielding region having a second conductivity type and being located between the drift structure and a first surface of the silicon carbide body;
    a first and a second trench gate stripe that extend into the silicon carbide body, the body region being in contact with a first sidewall of the first trench gate stripe and the shielding region being in contact with a second sidewall of the second trench gate stripe, the second sidewall having a first length in a first direction parallel to the first surface; and
    a supplementary region of the first conductivity type in contact with one or more interface areas of the second sidewall, the one or more interface areas having a combined second length along the first direction, the second length being at most 30% of the first length.

2. The semiconductor device of claim 1, wherein the silicon carbide body comprises an active region and a termination region surrounding the active region, and wherein the supplementary region is formed in the termination region and is absent in the active region.

3. The semiconductor device of claim 1, further comprising:
    a source region between the first surface and the body region,
    wherein the supplementary region and the source region are structurally connected.

4. The semiconductor device of claim 3, wherein a maximum dopant concentration in the supplementary region differs from a maximum dopant concentration in the source region.

5. The semiconductor device of claim 3, wherein a maximum vertical extension of the supplementary region is greater than a maximum vertical extension of the source region.

6. The semiconductor device of claim 1, wherein the semiconductor device comprises a plurality of interface areas, and wherein top portions of the shielding region laterally separate the plurality of interface areas along the first direction.

7. The semiconductor device of claim 1, wherein the one or more interface areas directly adjoin the first surface.

8. The semiconductor device of claim 1, wherein a surface portion of the shielding region separates the supplementary region and the first surface.

9. The semiconductor device of claim 1, further comprising:
    a contact portion extending from the first surface into the silicon carbide body,
    wherein the contact portion is in contact with the supplementary region.

10. The semiconductor device of claim 1, wherein a maximum dopant concentration in the shielding region is higher than a maximum dopant concentration in the body region.

11. A semiconductor device, comprising:
    a silicon carbide body comprising a drift structure having a first conductivity type, a body region, and a shielding region, the body region and the shielding region having a second conductivity type and being located between the drift structure and a first surface of the silicon carbide body;
    a first and a second trench gate stripe that extend into the silicon carbide body, the body region being in contact with a first sidewall of the first trench gate stripe and the shielding region being in contact with a second sidewall of the second trench gate stripe, the second sidewall having a first length in a first direction parallel to the first surface; and
    a supplementary region of the first conductivity type in contact with one or more interface areas of the second sidewall,
    wherein a surface portion of the shielding region separates the supplementary region and the first surface.

12. The semiconductor device of claim 11, wherein the one or more interface areas have a combined second length along the first direction, and wherein the second length is at most 40% of the first length.

13. The semiconductor device of claim 11, wherein the supplementary region extends along the second trench gate stripe in an active region of the silicon carbide body.

14. A semiconductor device, comprising:
    a silicon carbide body comprising a drift structure having a first conductivity type, a body region, and a shielding region, the body region and the shielding region having a second conductivity type and being located between the drift structure and a first surface of the silicon carbide body;
    a first and a second trench gate stripe extending into the silicon carbide body, the body region being in contact with a first sidewall of the first trench gate stripe and the shielding region being in contact with a second sidewall of the second trench gate stripe, the second sidewall having a first length in a first direction parallel to the first surface; and
    a supplementary region of the first conductivity type in contact with one or more interface areas of the second sidewall; and
    a contact portion extending from the first surface into the silicon carbide body and contacting the supplementary region,
    wherein the one or more interface areas have a combined second length along the first direction,
    wherein the second length is at most 30% of the first length.

15. The semiconductor device of claim 14, wherein the supplementary region extends along the second trench gate stripe in an active region of the silicon carbide body.

* * * * *